US011200930B1

(12) United States Patent
Valsala et al.

(10) Patent No.: US 11,200,930 B1
(45) Date of Patent: Dec. 14, 2021

(54) SYSTEM AND METHOD OF MASKING MEMORY READ REQUEST TO AVOID MEMORY READ CORRUPTION

(71) Applicant: Silicon Laboratories Inc., Austin, TX (US)

(72) Inventors: Harikrishnan Prabha Valsala, Singapore (SG); Hong Lee Koo, Singapore (SG); Shantonu Bhadury, Singapore (SG)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 17/109,398

(22) Filed: Dec. 2, 2020

(51) Int. Cl.
    *G11C 7/22* (2006.01)
    *G11C 7/04* (2006.01)
    *G11C 7/10* (2006.01)

(52) U.S. Cl.
    CPC ............. *G11C 7/222* (2013.01); *G11C 7/04* (2013.01); *G11C 7/1009* (2013.01); *G11C 7/1045* (2013.01)

(58) Field of Classification Search
    CPC ......... G11C 7/222; G11C 7/04; G11C 7/1009; G11C 7/1045
    See application file for complete search history.

(56) References Cited

U.S. PATENT DOCUMENTS

| 6,438,635 B1* | 8/2002 | Date | G06F 13/364 |
| | | | 710/113 |
| 2006/0221088 A1* | 10/2006 | Aoki | G06F 13/1689 |
| | | | 345/520 |
| 2012/0120741 A1* | 5/2012 | Kim | G11C 16/32 |
| | | | 365/189.14 |

* cited by examiner

*Primary Examiner* — Han Yang
(74) *Attorney, Agent, or Firm* — Gary Stanford; Huffman Law Group, PC

(57) ABSTRACT

A memory system including a memory device, cache controller circuitry, and timing circuitry. The memory device has a read enable input for receiving a read enable indication for requesting stored data, and has a minimum delay specification between consecutive read enable indications. The cache controller circuitry provides a read indication during a prefetch mode to read data from a next linear address from the memory device, provides a reading indication while data is being read, and provides a miss indication when a next processor address is not the next linear address. The timing circuitry includes synchronization circuitry receiving the read indication and a clock signal and provides a preliminary read enable indication, read enable circuitry receiving a mask indication and the preliminary read enable indication and providing the read enable indication, and mask circuitry that provides the mask indication when the reading indication and the miss indication are both provided.

20 Claims, 4 Drawing Sheets

SYSTEM AND METHOD OF MASKING MEMORY READ REQUEST TO AVOID MEMORY READ CORRUPTION

BACKGROUND OF THE INVENTION

Field of the Invention

The present invention relates in general to memory interfaces, and more particularly to a system and method of masking memory read request to avoid memory read corruption.

Description of the Related Art

It is often useful or desired to update semiconductor process or change semiconductor manufacturer for a given design. A different process or manufacturer may require modifications of the design for interfacing available systems, such as memory configurations or the like. As an example, an embedded sequential flash memory design provided for one process and/or manufacturer may differ for another process and/or manufacturer. It may be useful to avoid a complete redesign of a flash controller for interfacing a different sequential flash memory design to a microcontroller or central processing unit (CPU) of a system.

SUMMARY OF THE INVENTION

A memory system according to one embodiment includes a memory device, cache controller circuitry, and timing circuitry. The memory device has a read enable input for receiving a read enable indication for requesting stored data and has a minimum delay specification between consecutive read enable indications. The cache controller circuitry provides a read indication during a prefetch mode to request to read data from a next linear address of the memory device, provides a reading indication while data is being read from the memory device, and provides a miss indication when a next processor address is not the next linear address. The timing circuitry includes synchronization circuitry, read enable circuitry, and mask circuitry. The synchronization circuitry has a data input receiving the read indication, has a clock input receiving a clock signal having a period that is shorter than the minimum delay specification, and has an output providing a preliminary read enable indication. The read enable circuitry has a first input receiving a mask indication, has a second input receiving the preliminary read enable indication, and has an output providing the read enable indication to the read enable input of the memory device, in which the read enable indication follows the preliminary read enable indication unless the mask indication is provided. The mask circuitry provides the mask indication when the reading indication and the miss indication are both provided during the same clock cycle of the clock signal.

The synchronization circuitry may include a clock gate having a data input receiving the read indication, a clock input receiving the clock signal, and a data output, and delay circuitry having an input coupled to the data output of the clock gate and having an output providing the preliminary read enable indication. The delay circuitry may have a delay that ensures that the mask indication is provided before the preliminary read enable indication. The delay circuitry may be configured to provide a minimum amount of delay within process, voltage, and temperature variations. The delay circuitry may have a delay that ensures that the read enable indication is provided when address signals provided to the memory device are stable.

The read enable circuitry may be implemented using a Boolean logic AND gate. The mask circuitry may be implemented as a Boolean logic NAND gate having a first input receiving the reading indication, having a second input receiving the miss indication, and having an output providing the mask indication. The memory device may be a sequential flash memory device. The timing circuitry may mask a read indication from the cache controller circuitry when providing a read address that does not match the next processor address. The cache controller circuitry may provide the read indication with the next processor address in the next cycle of the clock signal.

A method of masking a memory read request to avoid read corruption of a memory having a minimum delay specification between consecutive read enable indications according to one embodiment includes receiving a read enable indication for requesting stored data from the memory, providing a read indication during a prefetch mode to request to read data from a next linear address of the memory device, providing a reading indication while data is being read from the memory device, providing a miss indication when a next processor address is not the next linear address, receiving and synchronizing the read indication with a clock signal having a period that is shorter than the minimum delay specification for providing a preliminary read enable indication, receiving a mask indication and the preliminary read enable indication and providing the read enable indication following the preliminary read enable indication unless the mask indication is provided, and providing the mask indication when the reading indication and the miss indication are both provided during the same cycle of the clock signal.

The method may include delaying the read indication providing the preliminary read enable indication. The method may include delaying the read indication the read indication to ensure that the mask indication is provided before the preliminary read enable indication. The method may include delaying to provide a minimum amount of delay within process, voltage, and temperature variations. The method may include delaying the read indication to ensure that the read enable indication is provided when address signals provided to the memory device are stable.

The method may include logically ANDing the mask indication and the preliminary read enable indication. The method may include logically NANDing the reading indication and the miss indication for providing the mask indication. The method may include receiving a read enable indication by a sequential flash memory device. The method may include masking a read indication from cache controller circuitry when providing a read address that does not match a next address from a processor. The method may include providing the read indication with a next processor address in a next cycle of the clock signal.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
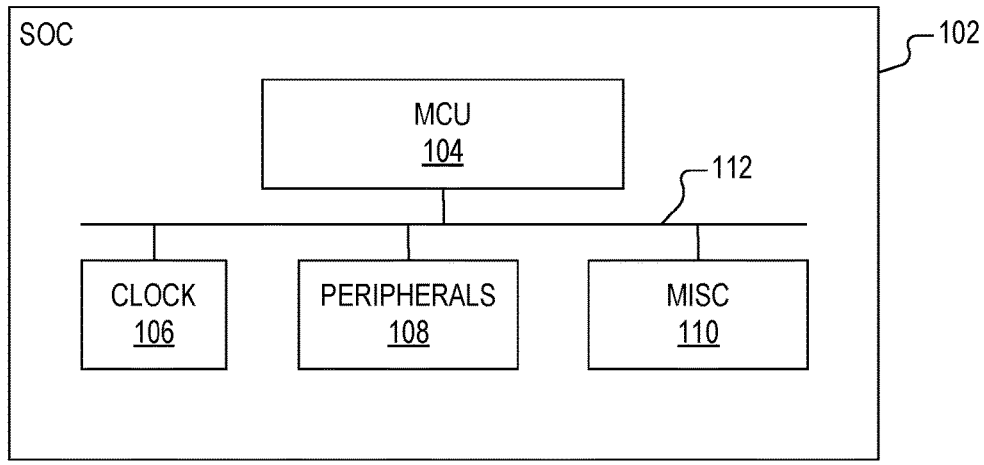
FIG. 1 is a simplified block diagram of an integrated circuit (IC) configured as a system-on-a-chip (SoC) including a microcontroller (MCU) implemented according to an embodiment of the present disclosure.

FIG. 1 is a simplified block diagram of an integrated circuit (IC) 102 configured as a system-on-a-chip (SoC) including a microcontroller (MCU) 104 implemented according to an embodiment of the present disclosure. The present invention is not limited to SoC configurations but applies to any processor and memory interface; an SoC configuration is shown and described herein only by way of example. The IC 102 may include clock circuitry 106, one or more peripherals 108, such as analog peripheral devices (e.g., sensors, analog to digital converters (ADCs), digital to analog converters (DACs), reference circuitry, etc.) and/or digital peripheral devices (e.g., universal asynchronous receiver/transmitters (UARTs), timers, modulators, configuration logic, etc.), and other miscellaneous (MISC) circuitry 110 interfacing the microcontroller 104 via a bus 112 or crossbar switches or other interfacing circuitry. The SoC may be configured and programmed for a variety of applications, such as motor control, industrial automation, consumer electronics, sensor controllers, home automation, appliances, toys, lighting control, optical modules, etc.

Figure 2:
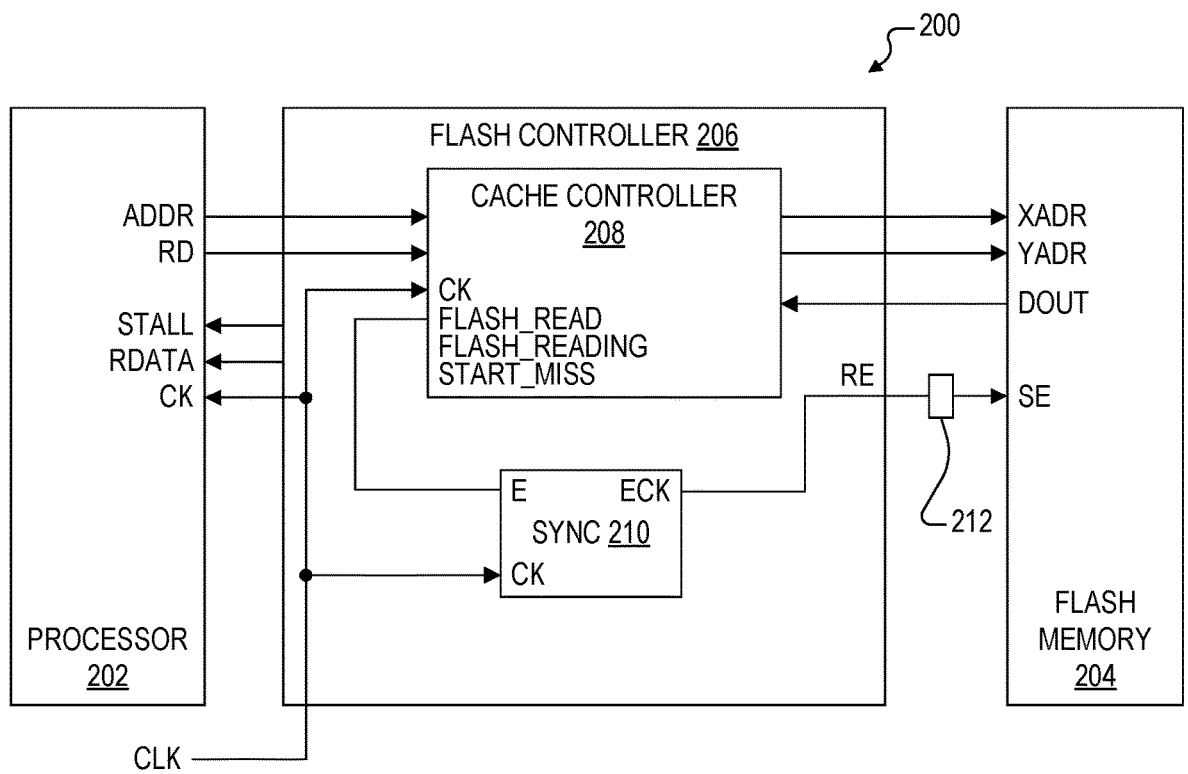
FIG. 2 is a more detailed block diagram of an MCU implemented according to one possible configuration which may be used as the MCU of FIG. 1.

FIG. 2 is a more detailed block diagram of an MCU 200 implemented according to one possible configuration which may be used as the MCU 104. The MCU 200 includes a processor 202 that is configured according to any type of processing device or processing circuitry such as, for example, a microprocessor or central processing unit (CPU) or the like. The MCU 200 also includes a sequential flash memory 204 and a flash controller 206 for providing a suitable interface between the processor 202 and the flash memory 204. The flash memory 204 is a non-volatile memory that may be electronically reprogrammed and erased during operation. Although not shown, the processor 202 may be interfaced with other types of volatile or non-volatile memory devices, such as any type of random access memory (RAM) or read-only memory (ROM) or the like.

The processor 202 provides address (ADDR) signals and asserts a read (RD) signal to the flash controller 206 to read data from the flash memory 204. The RD signal may be asserted for a single read cycle or may remain asserted for sequential read operations. The flash controller 206 translates read request cycles from the processor 202 into corresponding read operations with the flash memory 204 as further described herein, and provides the read data on corresponding RDATA signals to the processor 202. The flash controller 206 may pause or stall the processor 202 for one or more cycles by asserting a STALL signal to the processor 202.

The flash controller 206 includes a cache controller 208 and synchronization (SYNC) circuitry 210. Although not explicitly shown, the flash controller 206 also includes a cache memory controlled by the cache controller 208, in which the cache memory temporarily stores data read from the flash memory 204 for providing to the processor 202. The cache controller 206 receives the ADDR and RD signals from the processor 202 and the processor 202 and the flash controller 206 are synchronized by a system clock signal CLK. The flash controller 206 asserts a flash read request signal FLASH_READ to initiate read operations with the flash memory 204. As used herein, a signal is asserted by transitioning the signal from one logic level to another to provide a corresponding indication. For example, the flash controller 206 asserts FLASH_READ as a read indication to request read data from the flash memory 204.

In the illustrated configuration, the flash controller 206 asserts a first address XADR and a second address YADR for each read cycle to the flash memory 204, and receives output data on a data output (DOUT) bus from the flash memory 204. The synchronization circuitry 210 includes an enable (E) input receiving the FLASH_READ signal, a clock input CK receiving the CLK signal, and an enable output (ECK) providing a read enable (RE) signal to the SE input of the flash memory 204. RE is asserted as a read enable indication to the read enable input SE for requesting stored data from the flash memory 204. The synchronization circuitry 210 operates to synchronize read operations between the cache controller 208 and the flash memory 204. In one embodiment, the synchronization circuitry 210 may be implemented as an integrated clock gate (ICG) although alternative configurations are contemplated.

The flash controller 206 provides a FLASH_READING signal which is a status signal that is asserted as a reading indication for each cycle in which an actual read operation (or read cycle) with the flash memory 204 is occurring in the current CLK cycle. In addition, the flash controller 206 also provides a START_MISS signal which is a look-ahead a signal that is asserted as a miss indication to indicate that the current read operation is not currently in a miss state and that the cache controller 206 will transition to a miss state in next cycle of CLK.

In one embodiment, the MCU 200 may be based on or may be an updated version of the 8051 MCU architecture by the Intel Corporation. In one simplified embodiment, the processor 202 is an 8-bit CPU which outputs a 16-bit address ADDR, but the flash memory 204 has a 14-bit address separated into 7-bit address inputs XADR and YADR. Also, the RDATA input of the processor 202 is 8-bits whereas the DOUT data output of the flash memory 204 is 16-bits. Thus, the processor 202 and the flash memory 204 are implemented according to different architectures. The particular sizes of the address and data signals is arbitrary and may be different for different configurations. In any event, the flash controller 206 performs the address and data translations between the processor 202 and the flash memory 204.

The cache controller 208 is configured to perform prefetch operations in which it anticipates the next address from the processor 202 and initiates a read request to retrieve the corresponding data from the flash memory 204 for temporary storage in its local cache memory. Prefetch operations are intended to improve operation such that the processor 202 is provided requested data faster than normal read operations when the system clock period is shorter than the memory access time. The prefetch configuration, however, is configured to perform a simple linear prefetch which assumes that the ADDR provided by the processor 202 advances to the next linear address. Such prefetch configuration is advantageous when the processor 202 is reading a large chunk or a large group of sequentially stored data.

When the processor 202 performs a jump address to a different address, such as jumping forward in memory or jumping back during looping operations or the like, the anticipated linear prefetch address is incorrect.

When the cache controller 208 initiates a prefetch read operation using the next linear address that does not match the next address provided by the processor 202, it asserts the START_MISS signal, asserts the STALL signal to the processor 202, and initiates back-to-back read operations in sequential cycles of the CLK signal. In a legacy configuration operating at a slower clock signal and using a prior configuration of a flash memory, the legacy flash memory configuration monitored the input address for changes and was able to comply with the back-to-back read operations and provide valid data in time for the intended frequency of operation.

The IC 102 was previously implemented on a prior semiconductor processing method for which the legacy flash memory configuration was provided. The legacy flash memory, however, did not include the SE sense enable input. It is desired to implement the IC 102 using an updated semiconductor processing method for which the flash memory 204 is provided. The updated flash memory 204 includes the SE input along with a minimum delay specification between sequential read enable asserts of the SE input. The synchronization circuitry 210 is added to synchronize the flash controller 206 with the flash memory 204 to provide the read enable signal RE to the new SE input. A small delay circuit 212 is added between RE and SE to ensure that SE does not change while XADR/YADR are changing. It is also desired to operate the IC 102 at a frequency level in which CLK has a period that is less than the minimum delay specification of the flash memory 204. The cache controller 208 may add a one CLK cycle delay between normal sequential read operations so that the minimum delay specification is not violated. The back-to-back read operations, however, violate the minimum delay specification of the flash memory 204.

In one embodiment, for example, the prior semiconductor processing method was a legacy 180 nanometer (nm) process and the update semiconductor processing method is a 90 nm process. In addition, it is desired to operate the IC 102 and the MCU 200 at CLK frequency of 50 Megahertz (MHz) in which CLK has a corresponding period of 20 nanoseconds (ns). The minimum delay specification of the flash memory 204, however, is 25 ns. When the cache controller 208 adds a one CLK cycle between consecutive read operations, operation is within the 25 ns minimum delay specification since the delay between sequential assertions of SE is about 40 ns. When the cache controller 208 performs the back-to-back read operations in which sequential assertions of SE is only 20 ns, the flash memory 204 response is unpredictable and may generate and output corrupted data even though the second address provided from the processor 202 is correct.

Figure 3:
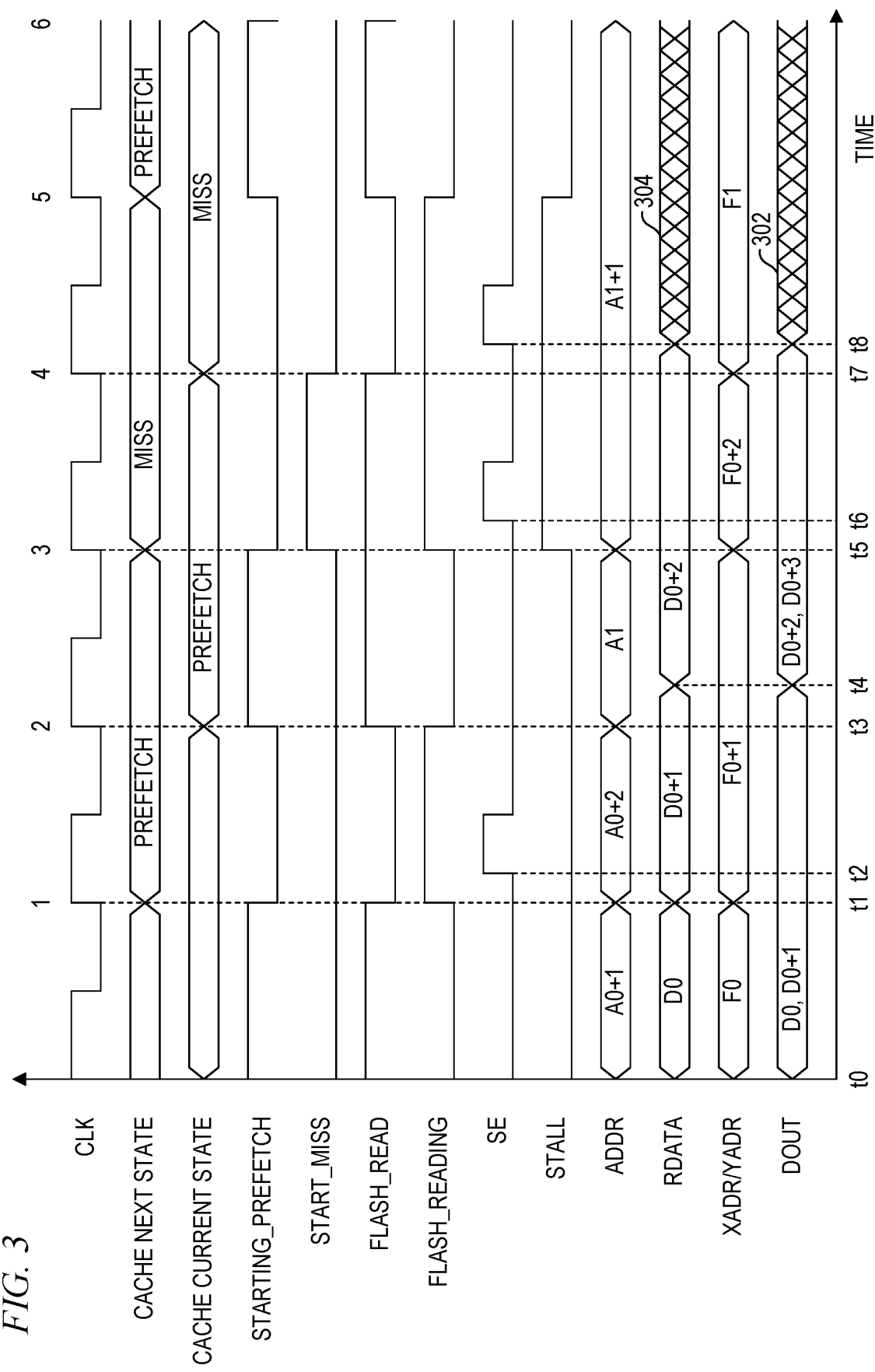
FIG. 3 is a timing diagram illustrating operation of the MCU of FIG. 2.

FIG. 3 is a timing diagram illustrating operation of the MCU 200. The timing diagram plots CLK, cache state machine signals CACHE NEXT STATE and CACHE CURRENT STATE, a signal STARTING_PREFETCH, and signals START_MISS, FLASH_READ, FLASH_READING, SE, STALL, ADDR, RDATA, XADR/YADR, and DOUT, versus time. The rising edge of CLK starts each subsequent clock cycle shown numbered in the diagram beginning with a CLK cycle numbered 1 up to beginning of CLK cycle 6. CACHE NEXT STATE is a next state indication and CACHE CURRENT STATE is the current state indication for the cache controller 208 in which PREFETCH and MISS are the two states of the cache controller 208 that can cause flash read operations. STARTING_PREFETCH is a look-ahead signal that is generated by the cache controller 208 to indicate that it will transition to a prefetch state in next CLK cycle, and is currently not in a PREFETCH state or when there is a new address available for read. START_MISS is a look-ahead signal that is generated by the cache controller 208 to indicate that it is currently not in a miss state but will transition to a miss state in next CLK cycle. START_MISS is used to indicate that the current read operation to the flash memory 204 is not correct, such as when an erroneous address has been provided. FLASH_READ is asserted when a read cycle will be initiated in the next CLK cycle, and is essentially equal to STARTING_PREFETCH OR START_MISS in which "OR" denotes the Boolean logic OR function.

In general, the processor 202 outputs an address on ADDR at a rising edge of CLK, and may provide a new address every CLK cycle during peak performance. The addresses are shown in simplified form, such as A0, A1, etc. The notation A0+1 denotes the next linear address after A0, A0+2 denotes the next linear address after A0+1, etc. The address A1 denotes a non-linear address or a jump behind or a jump ahead by more than the next linear address based on A0. The data provided to the RDATA input of the processor 202 from the flash memory 204 is expected to be valid two CLK cycles later from the start of the address asserted on ADDR. The notation D0 corresponds with address A0, the notation D0+1 corresponds with A0+1, etc. When the processor 202 is stalled upon assertion of the STALL signal, it holds the current address for as long as STALL is active.

XADR and YADR are combined into a corresponding flash address XADR/YADR shown in simplified form using notation F0, F1, etc. The notation F0+1 denotes the next linear address after F0, F0+2 denotes the next linear address after F0+1, etc. It is noted that the numerical flash addresses do not directly correspond with the numerical processor addresses. For example, F0 does not directly correspond with A0. The data provided on DOUT from the flash memory 204 assumes a similar notation as the data on RDATA, although DOUT is twice the size of RDATA in the illustrated configuration.

The processor 202 provides address A0+1 in a prior CLK cycle (CLK cycle 0) from an initial time t0 to time t1, and provides the next linear address A0+2 in the first CLK cycle 1 from time t1 to a subsequent time t3. The SE input of the flash memory 204 is asserted high at a time t2 just after time t1 during CLK cycle 1, in which the delay between t1 and t2 corresponds with the delay through the delay circuit 212. The flash controller 206 asserts a flash address F0+1 on XADR/YADR during CLK cycles 1 and 2 from time t1 to a subsequent time t5 at the end of CLK cycle 2. The flash memory 204 asserts D0+2 and D0+3 from a time t4 just after time t3 during CLK cycle 2 to a subsequent time t8 during CLK cycle 4, while D0+2 is provided on RDATA between times t4 and t8. The next linear processor address after A0+2 is A0+3. The processor 202, however, asserts a nonlinear address A1 from time t3 to t5 during CLK cycle 2.

In CLK cycle 2 beginning at time t3, the STARTING_PREFETCH signal is asserted high indicating that the cache controller 208 is beginning a PREFETCH state. The FLASH_READ signal is asserted high in response to the STARTING_PREFETCH signal. In CLK cycle 3 beginning at about time t5, the STARTING_PREFETCH signal goes low while the FLASH_READING signal goes high to begin the read operation associated with the prefetch operation of the cache controller 208. The cache controller 208 asserts flash address F0+2 as the next linear flash address associated with the presumed next processor address A0+3. The processor 202, however, has asserted a different address A1 that is not equal to the next linear address A0+3. For example, the processor 202 jumps backwards or jumps forward past the next linear address. The cache controller 208 detects the address mismatch and thus asserts the START_MISS signal high at time t5. In addition, the cache controller 208 also asserts the STALL signal at time t5 to stall operation of the processor 202 until the read operation can be corrected. Since START_MISS is asserted, the FLASH_READ signal remains asserted for CLK cycle 3 beginning at time t5.

Although not explicitly shown, the RE signal goes high at time t5 at the rising CLK edge in response to the FLASH_READ signal being asserted high in the prior cycle, in which any delay through the synchronization circuitry 210 is presumed negligible. After the delay through the delay circuit 212 after time t5, the SE signal is asserted high to the flash memory 204 at a time t6 for the read operation using the erroneous address F0+2. Since the START_MISS and FLASH_READ signals are asserted at the beginning of CLK cycle 3 at time t5, the cache controller 208 initiates an updated read operation in the next CLK cycle 4 beginning at time t7 in which the FLASH_READING signal stays high while START_MISS and FLASH_READ signals go low. After a short delay from time t7, the SE input of the flash memory 204 is asserted high for a subsequent read operation using the correct address A1. In this manner, the cache controller 208 is attempting back-to-back read operations in sequential cycles 3 and 4 of the CLK signal.

Since the CLK signal has a period which is shorter than the minimum delay specification of the flash memory 204, minimum delay specification of the flash memory 204 is violated since SE is asserted twice before the minimum delay specification has expired. Thus, the flash memory 204 is likely to output erroneous data on DOUT as shown at 302 at about time t8 during CLK cycle 4, which translates to erroneous data on RDATA provided to the processor 202 as shown at 304. The flash memory 204 may output the correct data in certain circumstances, but such is not guaranteed. The erroneous data corrupts operation even though the cache controller 208 has detected the error and is providing the correct next flash address F1 on XADR/YADR during the CLK cycle 4.

Figure 4:
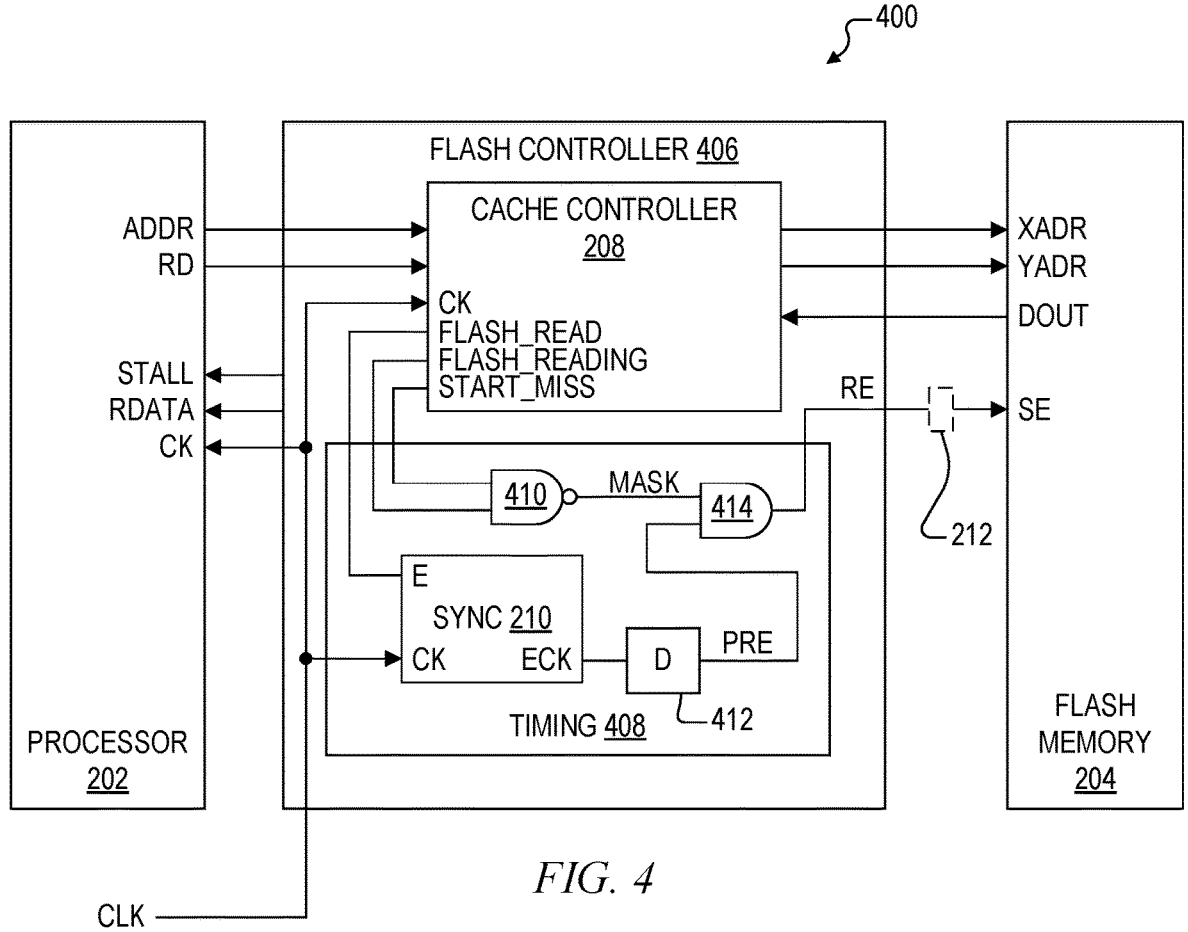
FIG. 4 is a more detailed block diagram of an MCU implemented according to one embodiment of the present disclosure which may be used as the MCU of FIG. 1.

FIG. 4 is a more detailed block diagram of an MCU 400 implemented according to one embodiment of the present disclosure which may be used as the MCU 104. The MCU 400 includes the processor 202 and the flash memory 204 which are implemented to operate in substantially the same manner as that shown and described for the MCU 200. The flash controller 206, however, is replaced by a flash controller 406. The flash controller 406 includes the cache controller 208 which is configured to operate in substantially the same manner shown and described for the flash controller 206 for controlling operation of the local cache memory. The flash controller 406, however, includes timing circuitry 408 for generating the RE signal provided to the SE input of the flash memory 204. The timing circuitry 408 includes the synchronization circuitry 210 which receives FLASH_READ and CLK and which has the same enable output ECK as previously described. The output signal ECK, however, is not provided as the RE signal to the SE input of the flash memory 204.

The timing circuitry 408 further includes mask circuitry 410 having inputs receiving the START_MISS and FLASH_READING signals and an output providing a MASK signal. MASK is asserted as a mask indication to mask PRE from being asserted as RE to the SE input of the flash memory 204 as further described herein. In one embodiment, the mask circuitry 410 is implemented as a 2-input Boolean logic NAND gate having a first input receiving the START_MISS signal, a second input receiving the FLASH_READING signal, and an output providing the MASK signal. The timing circuitry 408 further includes delay circuitry 412 that delays the ECK output for providing a preliminary read enable (PRE) signal. PRE is asserted as a preliminary read enable indication for requestion flash data. The timing circuitry 408 further includes read enable circuitry 414 having inputs receiving the MASK and PRE signals and an output providing the read enable signal RE. In one embodiment, the read enable circuitry 414 is implemented as a 2-input Boolean logic AND gate having a first input receiving the MASK signal, a second input receiving the PRE signal, and an output providing the RE signal.

The delay circuit 212 interposed between the RE output of the flash controller 406 and the SE input of the flash memory 204 is shown using a dashed line. In one embodiment, the delay circuitry 412 inserts sufficient delay so that the delay circuit 212 may be omitted. In another embodiment, the delay of the delay circuit 212 is modified (e.g., reduced) to account for the delay inserted by the delay circuitry 412.

Generally, the timing circuitry 408 allows normal read operations to proceed without any significant delay. When either one of the FLASH_READING and START_MISS signals is asserted low (including when both are asserted low) for normal read and successful prefetch operations, then the MASK signal is high so that operation is similar to that previously described. In particular, the SE signal is asserted in response to assertion of the ECK output of the synchronization circuitry 210 after relatively small delay through the delay circuitry 412 and the read enable circuitry 414. The delay through the delay circuitry 412 and read enable circuitry 414 is sufficiently small so that the read operation proceeds in the same CLK cycle as intended.

When the FLASH_READ signal is asserted by the cache controller 208 to initiate a prefetch read operation using the next linear address that does not match the actual address from the processor 202, however, then the FLASH_READ and START_MISS signals are both asserted in the next CLK cycle causing the mask circuitry 410 to also assert the MASK signal low in the next CLK cycle before the PRE signal at the output of the delay circuitry 412 is asserted high. In this manner, the incorrect prefetch read cycle is blocked or masked from reaching the flash memory 204. Thus, instead of receiving back-to-back read operations in sequential CLK cycles, the flash memory 204 only receives the second and correct read request so that the minimum delay specification of the flash memory 204 is avoided.

Figure 5:
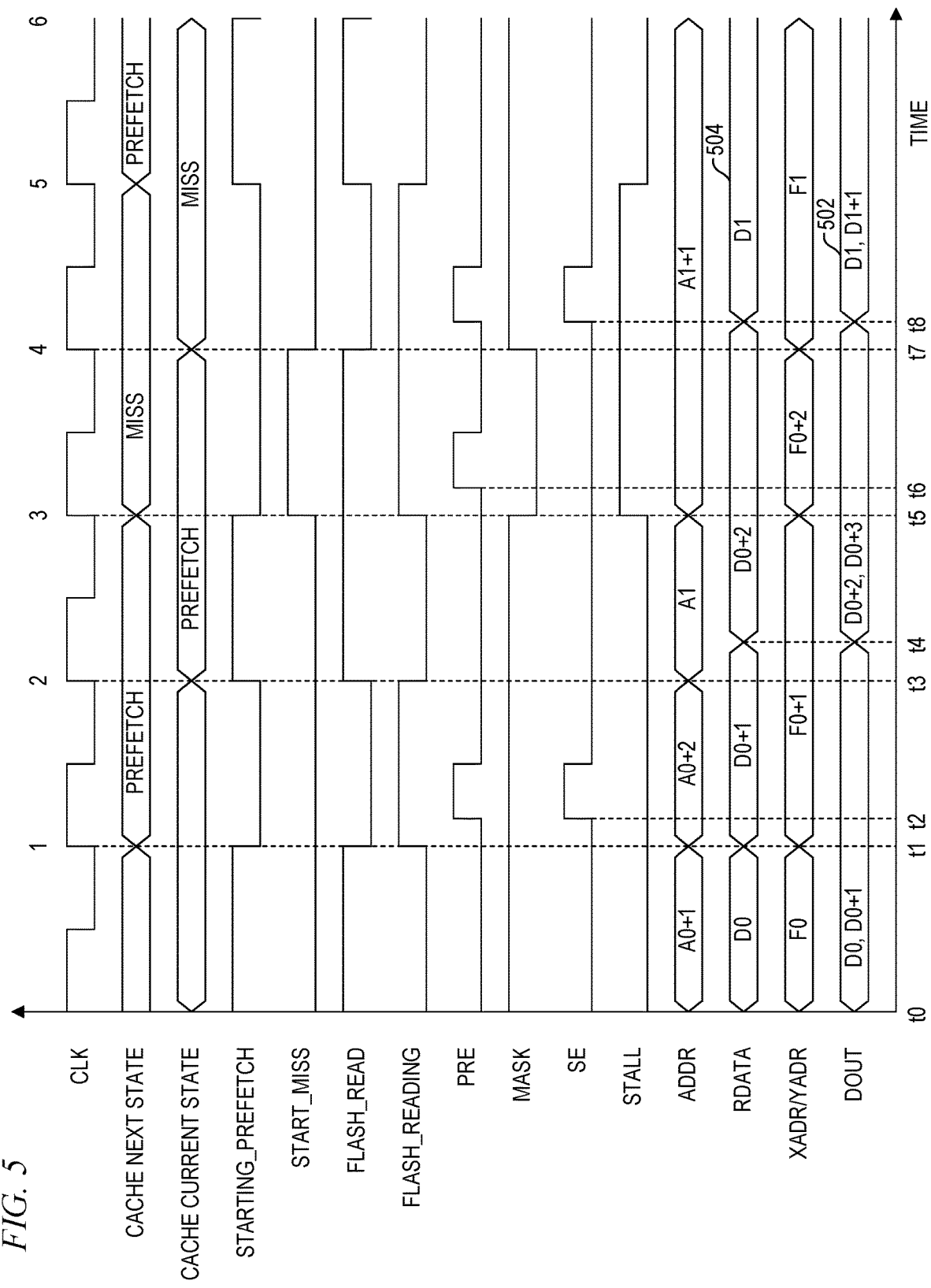
FIG. 5 is a timing diagram illustrating operation of the MCU of FIG. 4 according to an embodiment of the present disclosure.

FIG. 5 is a timing diagram illustrating operation of the MCU 400 according to an embodiment of the present disclosure. The timing diagram of FIG. 5 plots the signals with the same signal names versus time as FIG. 3 with the addition of the MASK and PRE signals. The PRE signal of FIG. 5 roughly corresponds with the SE signal of FIG. 3 with any delay difference between the delay circuit 212 and the delay circuitry 412. Operation up to time t5 is substantially similar as that described for FIG. 3. In addition, the MASK signal remains de-asserted high up to CLK cycle 3. At time t6 in CLK cycle 3 after delay through the delay circuitry 412, PRE goes high in response to the FLASH_READ signal previously asserted in CLK cycle 2. Also, at subsequent time t8 in CLK cycle 4, PRE goes high again in response to the FLASH_READ signal previously asserted in CLK cycle 3. Thus, the cache controller 208 is attempting to perform back-to-back read operations since the first read operation was incorrect since the processor 202 asserted address A1 rather than the linearly sequential address A0+3.

Since FLASH_READING and START_MISS are both high in CLK cycle 3, the MASK signal is asserted low from time t5 to time t7, and is then de-asserted back high beginning CLK cycle 4. Because of the delay through the delay circuitry 412, MASK is asserted low before PRE is asserted high during CLK cycle 3 so that the RE signal is blocked from being asserted in CLK cycle 3. In this manner, SE stays low in CLK cycle 3 so that the incorrect prefetch read operation is masked. In CLK cycle 4, MASK is de-asserted high before PRE is asserted high so that the RE signal is not blocked from being asserted in CLK cycle 4. In this manner, SE goes high after a small delay in CLK cycle 4, so that the correct read operation in response to the read cycle requested by the processor 202 in CLK cycle 2 is allowed to proceed in CLK cycle 4. Since the incorrect read operation in CLK cycle 3 is masked, the minimum delay specification of the flash memory 204 is not violated and the correct read operation initiated by the processor 202 proceeds without delay. Note correct data D1, D1+1 on DOUT as shown at 502 at about time t8 during CLK cycle 4, which translates to correct data D1 on RDATA provided to the processor 202 as shown at 504.

The delay circuitry 412 is configured to insert a minimal delay just sufficient to ensure that the PRE signal is asserted high after the MASK signal is de-asserted low for substantially all applicable conditions including expected process, temperature, and voltage variations. The delay of the delay circuitry 412 is sufficiently small to ensure that correct read operations are able to proceed in the same CLK cycle for which they were requested. In addition, because of the added delay of the delay circuitry 412, the delay circuit 212 may either be omitted or its delay reduced so that normal read operations remain substantially unmodified.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A memory system, comprising:
a memory device having a read enable input for receiving a read enable indication for requesting stored data, wherein the memory device has a minimum delay specification between consecutive read enable indications;
cache controller circuitry that provides a read indication during a prefetch mode to request to read data from a next linear address of the memory device, that provides a reading indication while data is being read from the memory device, and that provides a miss indication when a next processor address is not the next linear address; and timing circuitry, comprising:
synchronization circuitry having a data input receiving the read indication, having a clock input receiving a clock signal having a period that is shorter than the minimum delay specification, and having an output providing a preliminary read enable indication;
read enable circuitry having a first input receiving a mask indication, having a second input receiving the preliminary read enable indication, and having an output providing the read enable indication to the read enable input of the memory device, wherein the read enable indication follows the preliminary read enable indication unless the mask indication is provided; and
mask circuitry that provides the mask indication when the reading indication and the miss indication are both provided during the same clock cycle of the clock signal.

2. The memory system of claim 1, wherein the synchronization circuitry comprises:
a clock gate having a data input receiving the read indication, having a clock input receiving the clock signal, and having a data output; and
delay circuitry having an input coupled to the data output of the clock gate and having an output providing the preliminary read enable indication.

3. The memory system of claim 2, wherein the delay circuitry has a delay that ensures that the mask indication is provided before the preliminary read enable indication.

4. The memory system of claim 2, wherein the delay circuitry is configured to provide a minimum amount of delay within process, voltage, and temperature variations.

5. The memory system of claim 2, wherein the delay circuitry has a delay that ensures that the read enable indication is provided when address signals provided to the memory device are stable.

6. The memory system of claim 1, wherein the read enable circuitry comprises a Boolean logic AND gate.

7. The memory system of claim 1, wherein the mask circuitry comprises a Boolean logic NAND gate having a first input receiving the reading indication, having a second input receiving the miss indication, and having an output providing the mask indication.

8. The memory system of claim 1, wherein the memory device comprises a sequential flash memory device.

9. The memory system of claim 1, wherein the timing circuitry masks a read indication from the cache controller circuitry when providing a read address that does not match the next processor address.

10. The memory system of claim 1, wherein the cache controller circuitry provides the read indication with the next processor address in the next cycle of the clock signal.

11. A method of masking a memory read request to avoid read corruption of a memory having a minimum delay specification between consecutive read enable indications, comprising:
receiving a read enable indication for requesting stored data from the memory;
providing a read indication during a prefetch mode to request to read data from a next linear address of the memory device;
providing a reading indication while data is being read from the memory device;
providing a miss indication when a next processor address is not the next linear address;
receiving and synchronizing the read indication with a clock signal having a period that is shorter than the minimum delay specification for providing a preliminary read enable indication;

receiving a mask indication and the preliminary read enable indication and providing the read enable indication following the preliminary read enable indication unless the mask indication is provided; and providing the mask indication when the reading indication and the miss indication are both provided during the same cycle of the clock signal.

12. The method of claim 11, wherein the receiving and synchronizing comprises delaying the read indication providing the preliminary read enable indication.

13. The method of claim 12, wherein the delaying comprises delaying to ensure that the mask indication is provided before the preliminary read enable indication.

14. The method of claim 12, wherein the delaying provides a minimum amount of delay within process, voltage, and temperature variations.

15. The method of claim 12, wherein the delaying comprises delaying to ensure that the read enable indication is provided when address signals provided to the memory device are stable.

16. The method of claim 11, wherein the providing the read enable indication following the preliminary read enable indication unless the mask indication is provided comprises logically ANDing the mask indication and the preliminary read enable indication.

17. The method of claim 11, wherein the providing the mask indication comprises logically NANDing the reading indication and the miss indication for providing the mask indication.

18. The method of claim 11, wherein the receiving a read enable indication comprises receiving a read enable indication by a sequential flash memory device.

19. The method of claim 11, further comprising masking a read indication from cache controller circuitry when providing a read address that does not match a next address from a processor.

20. The method of claim 11, further comprising providing the read indication with a next processor address in a next cycle of the clock signal.

\* \* \* \* \*